(12) United States Patent
Naba et al.

(10) Patent No.: US 6,569,514 B2
(45) Date of Patent: May 27, 2003

(54) CERAMIC CIRCUIT BOARD AND METHOD OF MANUFACTURING THE SAME

(75) Inventors: Takayuki Naba, Ibo-Gun (JP); Haruhiko Yamaguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/957,040

(22) Filed: Sep. 21, 2001

(65) Prior Publication Data

US 2002/0060091 A1 May 23, 2002

(30) Foreign Application Priority Data

Sep. 22, 2000 (JP) .................................... 2000-289366
Sep. 17, 2001 (JP) .................................... 2001-281786

(51) Int. Cl.$^7$ ............................................... B32B 3/00
(52) U.S. Cl. ........................ 428/210; 428/612; 428/687
(58) Field of Search ............................. 428/210, 612, 428/687

(56) References Cited

U.S. PATENT DOCUMENTS 5,672,848 A * 9/1997 Komorita et al. .......... 174/260
6,284,985 B1 * 9/2001 Naba et al. ................ 174/260
6,426,154 B1 * 7/2002 Naba et al. ................ 428/620

FOREIGN PATENT DOCUMENTS

| JP | 10-67586 | 3/1998 |
| JP | 11-4063 | 1/1999 |
| JP | 2000-34172 | 2/2000 |

* cited by examiner

*Primary Examiner*—Cathy Lam
(74) *Attorney, Agent, or Firm*—Oblon, Spivak, McClelland, Maier & Neustadt, P.C.

(57) ABSTRACT

The present invention provides a ceramic circuit board comprising: a ceramic substrate and a metal circuit portion bonded to at least one main surface of the ceramic substrate; wherein each of ratios of Ra1/Ra2 and Ra2/Ra1 is 1.5 or less in which a surface roughness in terms of arithmetical average surface roughness Ra in arbitral one direction of the ceramic substrate is Ra1 while a surface roughness Ra in a direction normal to the one direction of the ceramic substrate is Ra2, and a breakdown voltage of the ceramic substrate is 20 kV/mm or more. According to the above structure of the present invention, there can be provided a ceramic circuit board having an excellent heat-cycle resistance and bending strength characteristics without impairing a heat radiating property, and capable of increasing an operating reliability as electronic device.

7 Claims, 2 Drawing Sheets

CERAMIC CIRCUIT BOARD AND METHOD OF MANUFACTURING THE SAME

BACKGROUND OF THE INVENTION

1. Field of the Invention

The present invention relates to a ceramic circuit board and a method of manufacturing the same, and more particularly to a ceramic circuit board improved in heat-cycle resistant characteristic, bending strength characteristic and heat radiating property.

2. Description of the Related Art

Conventionally, a ceramic circuit board has been widely applied to various electronic devices or semiconductor devices. Such ceramic circuit board is manufactured by a method comprising the steps of: forming a metal circuit plate having a predetermined wiring pattern; and integrally bonding the metal circuit plate onto a ceramic substrate or integrally bonding the metal circuit plate to the ceramic substrate through a brazing layer containing an active metal. There has been also used a ceramic circuit board manufactured by a method comprising the steps of: bonding a metal plate to a surface of the ceramic substrate; and etching the metal plate so as to form a predetermined wiring pattern.

In particular, in case of the ceramic circuit board to be used in a power transistor module for mounting a high power semiconductor element radiating a large amount of heat, an aluminum nitride (AlN) having a high thermal conductivity is used as the ceramic substrate for the purpose of improving a heat radiating property of entire circuit board, while a metal plate such as copper (Cu) or the like similarly having a high thermal conductivity is used as the metal circuit plate.

More concretely, above the ceramic circuit boards had been manufactured, for example, in accordance with a direct bonding copper method (DBC method) comprising the steps of: directly arranging circuit plate composed of metal such as copper or the like on a surface of ceramic sintered body substrate such as $Al_2O_3$, AlN or the like; heating the substrate and the circuit plate so as to generate an eutectic compound composed of metal component and oxygen; and directly and firmly bonding the metal plate such as copper plate or the like onto the surface of the ceramic substrate using the eutectic compound as a bonding material, or the ceramic circuit board had been manufactured in accordance with an active metal brazing method in which the ceramic substrate and the circuit plate are integrally bonded through a brazing material such as Ag—Cu—Ti type paste containing an active metal of Ti.

As described above, since the circuit plate is formed of copper excellent in thermal conductivity and electrical conductivity, an operational delay of the circuit can be decreased and a life of the circuit wiring can be prolonged. In addition, a wettability with respect to the bonding material such as solder or the like is improved, so that the semiconductor element (IC chip) or an electrode plate can be bonded on the surface of the ceramic substrate with a high bonding strength. As a result, a property for radiating heat generated from the semiconductor chip and an operative reliability of the semiconductor element can be maintained in a good condition.

However, among the above ceramic circuit boards, in the ceramic circuit boards using the $Al_2O_3$ substrate or a silicon nitride ($Si_3N_4$) substrate, since the thermal conductivity of the substrate is low, a good heat-radiating property cannot be obtained at all. For this reason, there is posed a problem that the present technical stage cannot sufficiently cope with the heat-radiating countermeasure required for realizing a high-density integration and a high-power output of the semiconductor element.

Further, in a case where the silicon nitride ($Si_3N_4$) substrate having a low thermal conductivity is used as the ceramic substrate, the substrate is required to be made thin so as to reduce the heat resistance thereof. For this reason, conventionally, the thinned substrate has been manufactured in such a manner that $Si_3N_4$ material powder was press-molded and sintered to form a sintered body, thereafter, the sintered body was subjected to a grinding work for a long time until a thin substrate having a predetermined thickness was obtained. Therefore, there were some cases where grinding flaws were caused on the $Si_3N_4$ substrate and a surface portion was partially fallen out due to impact forces applied during the grinding work thereby to cause a number of chipping flaws. As a result, there was posed a problem that these grinding flaws and the chipping flaws exert a bad influence on transverse strength, heat cycle resistance and withstand voltage characteristic of the ceramic circuit board.

In the above conventional ceramic circuit board using the above silicon nitride substrate as the ceramic substrate, a high bonding strength and a good heat-cycle resistive characteristic can be obtained, while a bending strength is low due to the grinding flaws formed to the ceramic substrate and the withstand voltage characteristic between a front surface and a rear surface of the substrate cannot attain to a level of sufficiently satisfying the technical requirements for the circuit board. In addition, there is also posed a problem that when the thickness of the substrate is increased so as to realize a high transverse load, the heat-radiating property of the entire circuit board is disadvantageously lowered.

In addition, in a case where the AlN substrate is used, although a high thermal conductivity and a sufficient heat-radiating property can be obtained, since the strength of AlN substrate per se is low, cracks are liable to occur due to heat load repeatedly applied to the substrate, thus arising a problem of deteriorating, so called, heat cycle resistance characteristic. As a result, there was also posed a problem that the metal circuit plate was peeled off due to the heat load repeatedly applied to the substrate during the operation of the circuit board thereby to abruptly decrease the heat-radiating property, so that the operative reliability of the electronic device was also decreased.

Further, in the ceramic circuit board using the conventional ceramic substrate, in order to secure a structural strength of the circuit board to some extent, the thickness of the ceramic substrate is required to set to be large, thus being an obstacle to realize a high-density packaging for the electronic devices.

Furthermore, the circuit board using a ceramic substrate having a large thickness has a poor toughness or tenacity and the circuit board is hardly deflected. Therefore, when an IC chip is bonded to this ceramic circuit board and the ceramic board is accommodated in a package thereby to form a semiconductor module thereafter the module is mounted and fixed onto a mounting board of the electronic device by a screw, a bending stress caused by fastening the screw is applied to the ceramic substrate, so that there is posed a problem that a defective such as crack or the like is liable to occur in the ceramic circuit board thereby to lower the production yield of the electronic devices, and a reliability and durability of the circuit board are disadvantageously lowered.

Conventionally, the technical requirements for the ceramic circuit board were to comprise a high bonding strength of the metal circuit plate and high heat-radiating property of entire circuit board. However, as an integration degree and level of an output power for the semiconductor element are further advanced in these days, the ceramic substrate has been further required to have a high bending strength (high transverse strength) so as not to be broken and largely deflected even if a severe heat cycle or a large bending strength is applied to the circuit board.

SUMMARY OF THE INVENTION

The present invention had been achieved for solving the aforementioned problems. Accordingly, an object of the present invention is to provide a ceramic circuit board having an excellent heat-cycle resistance property and bending strength property without impairing a heat-radiating property and capable of improving an operating reliability as an electronic device, and to provide a method of manufacturing the ceramic circuit board, and capable of mass-producing the ceramic circuit board with a low cost.

In order to attain the objects described above, the inventors of the present invention had investigated causes and factors to generate the cracks or chips when the ceramic circuit board or a heater substrate is assembled or operated, and reviewed various countermeasures to eliminate above causes. As a result, the inventors had found that an anisotropy in surface roughness of the ceramic substrate constituting the circuit board had a great influence on the transverse strength of the circuit board, and found that when the anisotropy in surface roughness of the ceramic substrate is controlled to a predetermined level or less, the transverse strength of the ceramic substrate can be increased. Therefore, when such ceramic substrate is used, there can be firstly realized a circuit board having less cracks, high withstand voltage characteristic and a high reliability. The present invention had been achieved on the basis of the aforementioned findings.

That is, according to the present invention, there is provided a ceramic circuit board comprising: a ceramic substrate and a metal circuit portion bonded to at least one main surface of the ceramic substrate; wherein each of ratios of Ra1/Ra2 and Ra2/Ra1 is 1.5 or less in which a surface roughness in terms of arithmetical average surface roughness Ra in arbitral one direction of the ceramic substrate is Ra1 while a surface roughness Ra in a direction normal to the one direction of the ceramic substrate is Ra2, and a breakdown voltage of the ceramic substrate is 20 kV/mm or more.

Further, in the above ceramic circuit board, it is preferable that the ceramic substrate is composed of a silicon nitride sintered body having a thermal conductivity of 60 W/mK or more.

Furthermore, in the above ceramic circuit board, it is preferable that the metal circuit portion is bonded to the ceramic substrate through a brazing material layer containing at least one active metal selected from the group consisting of Ti, Zr, Hf, Al and Nb.

Furthermore, it is preferable that the metal circuit portion is composed of a metal circuit plate, and a bonding strength of the metal circuit plate is 12 kN/m or Furthermore, it is preferable that the ceramic substrate has a thickness of 0.7 mm or less. Further, it is also preferable that the ceramic substrate has a thickness of 0.4 mm or less. Furthermore, it is also preferable that each of the surface roughness Ra1 and Ra2 of the ceramic substrate is 0.6 µm or less. In addition, it is also preferable that a chipping flaw having a diameter of 1 µm or more is not substantially formed on the surface of the ceramic substrate.

On the other hand, a method of manufacturing a ceramic circuit board according to the present invention comprises a ceramic substrate and a metal circuit portion bonded to at least one main surface of the ceramic substrate, the method comprising the steps of:

conducting a honing treatment to the ceramic substrate by blasting abrasive grains onto the sintered surface of the ceramic substrate;

removing abrasive grain chips (segments) adhered to the ceramic substrate during the honing treatment; and forming a metal circuit portion on the honing-treated surface of the ceramic substrate.

In the above method of manufacturing the ceramic circuit board, it is preferable that the step of removing abrasive grain segments and chips adhered to the ceramic substrate during the honing treatment is an ultrasonic cleaning. In addition, it is preferable that ceramic substrate is not subjected to a mechanical grinding work.

A material constituting the ceramic substrate for the ceramic circuit board is not particularly limited, and oxide-type ceramic sintered body such as aluminum oxide (alumina: $Al_2O_3$) or the like; and nitride-type ceramic sintered body such as silicon nitride ($Si_3N_4$), aluminum nitride (AlN) or the like can be used. In particular, since silicon nitride ($Si_3N_4$) inherently possesses a high bending strength in comparison with other ceramic sintered bodies and can be formed to be thin so as to reduce a heat resistance, the silicon nitride ($Si_3N_4$) sintered body is suitable as a material for constituting the ceramic circuit board of the present invention.

To put it concretely, it is preferable to use a ceramic substrate composed of a high thermal conductive silicon nitride sintered body in which at least part of the grain boundary is crystallized and having a thermal conductivity of 60 W/mK or more as disclosed in a prior Japanese Patent Application (Laid Open) No. 2000-34172 filed by the outstanding applicant.

The above high thermal conductive silicon nitride sintered body preferably used in the present invention is characterized by containing: 2.0 to 17.5% by weight of a rare earth element in terms of the amount of an oxide thereof; 0.3 to 3.0% by weight of Mg in terms of the amount of an oxide thereof; and at most 0.3% by weight of Al, Li, Na, K, Fe, Ba, Mn and B as impurity cationic elements in terms of total amount thereof, comprising a silicon nitride crystal phase and a grain boundary phase, and having a ratio of a crystal compound phase formed in the grain boundary phase to the entire grain boundary phase of at least 20%.

The above high thermal conductive silicon nitride sintered body used in the present invention is produced in accordance with the following method. That is, the method characterized by comprising the steps of: forming a compact (molded body) by molding a mixture obtained by adding 2.0 to 17.5% by weight of a rare earth element in terms of the amount of an oxide thereof, 0.3 to 3.0% by weight of Mg in terms of the amount of an oxide thereof, and if required, at most 1.5% by weight of at least one of calcium (Ca) and strontium (Sr) in terms of an oxide thereof, to a silicon nitride powder which contains at most 1.7% by weight of oxygen, at most 0.3% by weight of Al, Li, Na, K, Fe, Ba, Mn and B as impurity cationic elements in terms of total amount thereof, and at least 90% by weight of alpha-phase type silicon nitride, and which has an average grain size of at most 1.0 µm; degreasing the compact; sintering the compact at a temperature of 1,700–1,900° C. under an atmosphere of normal pressure or pressurized atmosphere thereby to form a sintered body; and moderately cooling the sintered body at a cooling rate of at most 100° C. per hour until the temperature is reduced to a point at which a liquid phase formed by the rare earth element and MgO during the sintering step solidifies.

To achieve good sintering characteristics of high strength and high thermal conductivity of the product, the silicon nitride fine powder which is used in the method of the invention and contained as a main component in the sintered body of the invention contains at most 1.7%, preferably, 0.5–1.5%, by weight of oxygen, at most 0.3%, preferably, 0.2% or less, by weight of Li, Na, K, Fe, Ba, Mn and B as impurity cationic elements in terms of total amount thereof, and at least 90%, more preferably, at least 93%, by weight of alpha-phase type silicon nitride, and, further the powder has fine grains, that is, an average grain size of at most 1.0 μm, more preferably about 0.4–0.8 μm.

The use of a fine powder of silicon nitride having an average grain size of 1.0 μm or less facilitates forming a dense sintered body having a porosity of at most 2.5% by volume without requiring a large amount of a sintering assistant agent, and therefore reduces the potential adverse effect of a sintering assistant agent on the thermal conductivity of the sintered body.

The total amount of the impurity cationic elements contained in the sintered body, that is, Al, Li, Na, K, Fe, Ba, Mn and B, is limited to at most 0.3% by weight in order to ensure the thermal conductivity of at least 70 W/mK, because the impurity cationic elements adversely affect the thermal conductivity of the sintered body. In particular, for the same reason described above, the total amount of the impurity cationic elements is more preferably set to be at most 0.2% by weight. In this case, since the silicon nitride powder used to obtain an ordinary silicon nitride sintered body contains a relatively large amounts of Fe and Al, a total amount of Fe and Al is used as a criteria for the total amount of impurity cationic elements.

The use of a silicon nitride powder containing at least 90% by weight of alpha-phase type silicon nitride, which has better sintering characteristics than a beta-phase type, facilitates producing a high-density sintered body.

Examples of the rare earth element to be added as a sintering assistant agent to a silicon nitride powder are Y, Ho, Er, Yb, La, Sc, Pr, Ce, Nd, Dy, Sm and Gd. Such a rare earth element may be added to the silicon nitride powder in the form of an oxide thereof or a substance which is changed into an oxide thereof during the sintering process. Two or more kinds of such oxide or substance may be added to the silicon nitride powder. Such a sintering assistant agent reacts with the silicon nitride powder so as to form a liquid phase and thereby serves as a sintering promoter.

The amount of a sintering assistant agent to be contained in the material powder is set to be within a range of from 2.0% to 17.5% or less by weight in terms of the amount of an oxide thereof. If the amount is less than 2.0% by weight, the sintered body fails to achieve a sufficiently high density and high thermal conductivity. In particular, when an element which has a large atomic weight like lanthanoid is used as the rare earth element at above less amount, a sintered body having relatively low strength and relatively low thermal conductivity is formed.

On the other hand, if the amount is more than 17.5% by weight, an excessively large portion of the grain boundary phase is formed, thereby reducing the thermal conductivity and strength of the sintered body. For this reason, the amount of a sintering assistant agent is within the range described above. For the same reason described above, the more preferred range of the amount of a sintering assistant agent is 3 to 15% by weight.

In the above sintered body, an oxide (MgO) of magnesium (Mg) to be used as addition component in the present invention promotes a function of the above rare earth element as sintering promoter thereby to enable the sintered body to be densified at a low temperature range. In addition, magnesium oxide (MgO) has a function of controlling a grain growth in the crystal structure of the sintered body thereby to increase the mechanical strength of $Si_3N_4$ sintered body. Further, the magnesium oxide provides an effect of lowering a transition temperature at which $\alpha$-$Si_3N_4$ material is changed to $\beta$-$Si_3N_4$ during sintering operation thereby to decrease a surface roughness of the sintered body surface, and provides an effect of decreasing the size of the pore or void to be formed on surface portion of the sintered body thereby to increase the strength at the sintered surface of the sintered body.

If the addition amount of Mg is less than 0.3% by weight in terms of an oxide thereof, the sintered body fails to achieve a sufficiently addition effect. If the amount is greater than 3.0% by weight, the thermal conductivity of the sintered body is reduced. For this reason, the preferred range of the amount of magnesium oxide is set to 0.3–3.0% by weight, preferably, 0.5–2% by weight.

In the above $Si_3N_4$ sintered body, Hf may be added as an optional component at a predetermined amount. Hf to be used as an addition component is added as oxides, carbides, nitrides, silicides and borides. These compounds promote a function of rare earth element as sintering promoter, and promote a function of promoting the crystallization of the grain boundary phase, thereby to improve thermal conductivity and mechanical strength of the $Si_3N_4$ sintered body.

If the amount of Hf contained is less than 0.3% by weight in terms of an oxide thereof, the sintered body fails to achieve a sufficiently addition effect. In contrast, if the amount exceeds 3.0% by weight, the thermal conductivity, mechanical strength and electrical breakdown strength of the sintered body are reduced. For this reason, the preferred range of the amount of hafnium oxide contained is set to 0.3–3.0% by weight.

Further, in the above sintered body used in the present invention, oxides (CaO, SrO) of Ca and Sr may also be added as other optional components at a predetermined amount. These oxides promote a function of rare earth element as sintering promoter. In particular, these compounds provide a remarkable effect when the sintering is conducted under atmosphere of a normal pressure.

If total addition amount of CaO and SrO contained is less than 0.1% by weight, a sintering operation at a higher temperature is disadvantageously required. In contrast, if the amount exceeds 1.5% by weight, an excessive amount of grain boundary phase is generated thereby to lower the thermal conductivity. For this reason, the range of the amount of calcium oxide and strontium oxide to be contained is set to 1.5% or less by weight, preferably to 0.1–1.0% by weight. In particular, in order to secure good performance in both strength and thermal conductivity, the addition amount is preferably set to a range of 0.1–0.75% by weight.

Further, in the above sintered body, Ti, Zr, V, Nb, Ta, Cr, Mo and W may also be added as another optional components at a predetermined amount. These elements to be used as another addition component are added to the sintered body as oxides, carbides, nitrides, silicides and borides thereof. These compounds promote the sintering assistant effect of the rare earth element, and promotes dispersion thereof in the crystal structure so as to enhance the mechanical strength of the silicon nitride ($Si_3N_4$) sintered body. Among them, compounds of Ti and Mo are particularly preferred.

If the amount of these compounds contained is less than 0.1% by weight, the sintered body fails to achieve a sufficiently addition effect. If the amount is greater than 3.0% by weight, the thermal conductivity, mechanical strength and electrical breakdown strength of the sintered body are reduced. For this reason, the preferred range of the amount of these compounds contained is 0.1–1.5% by weight. In particular, the amount is more preferably set to a range of 0.2–1.0% by weight.

The above compounds such as Ti and Mo or the like also serve as light blocking agents (light shielding agents). More specifically, they color the silicon nitride sintered body black and thus provides it with an opacity. For this reason, a circuit board on which an integrated circuit or the like which tends to malfunction when exposed to light is packaged is to be manufactured, the compounds of Ti and the like are preferably added to the silicon nitride powder so as to form a silicon nitride substrate having excellent light blocking characteristics.

Since the porosity of a sintered body significantly affects the thermal conductivity and strength of the sintered body, the porosity is preferably set to 2.5 vol % or less. If the porosity is greater than 2.5% by volume, the sintered body fails to achieve the high thermal conductivity, and the thermal conductivity and strength of the sintered body are reduced to undesired levels.

Although a silicon nitride sintered body is structurally constituted by a silicon nitride crystal phase and a grain boundary phase, the ratio of the crystal compound phase to the grain boundary phase significantly affects the thermal conductivity of the sintered body. In the high thermal conductive silicon nitride sintered body used in the present invention, the ratio of the crystal compound phase to the grain boundary phase is required to be set to 20% or higher, more preferably, 50% or higher. If the ratio is less than 20%, the sintered body fails to achieve a high thermal conductivity of at least 70W/mK and, therefore, a sintered body having good heat-radiating characteristics and a desirable high-temperature strength cannot be obtained.

To ensure that the porosity of the silicon nitride sintered body is limited to at most 2.5% by volume and the ratio of a crystal phase formed in the grain boundary phase to the entire grain boundary phase becomes at least 20%, it is important that a silicon nitride molded compact must be sintered by normal-pressure-sintering method or pressured-sintering method at temperature of 1,700–1,900° C. for about 2–10 hours immediately followed by cooling the sintered body at a rate of 100° C. per hour or slower.

If the sintering temperature is lower than 1,700° C., the sintered body fails to achieve a sufficiently high density; more specifically, the porosity becomes greater than 2.5 vol %, thereby reducing both the mechanical strength and thermal conductivity of the sintered body to undesired levels. On the other hand, if the sintering temperature is higher than 1,900° C., the silicon nitride component per se becomes likely to evaporate or decompose. In particular, if pressured-sintering process is not performed but the sintering process is performed under the normal pressure, the decomposition and evaporation of the silicon nitride component may occur at about 1,800° C.

The rate of cooling a sintered body immediately upon completion of the sintering operation is an important control factor to achieve crystallization of the grain boundary phase. If the sintered body is rapidly cooled at a cooling rate higher than 100° C. per hour, the grain boundary phase of the sintered body structure becomes an amorphous phase (glass phase) and, therefore, the ratio of a crystal phase formed of the liquid phase to the entire grain boundary phase becomes less than 20%. Thereby, the strength and thermal conductivity of the sintered body are reduced to undesired levels.

The sufficiently broad temperature range in which the cooling rate must be precisely controlled is from a predetermined sintering temperature (1,700–1,900° C.) to the solidifying point of the liquid phase formed by the reaction of the sintering assistant agent as described above. The liquid phase solidifies at about 1,600–1,500° C. if the sintering assistant agent as described above is used. By maintaining the cooling rate at 100° C. per hour or slower, preferably, 50° C. per hour or slower, more preferably, 25° C. per hour or slower, at least in a temperature range from the above sintering temperature to the solidifying point of the liquid phase, 20% or more, preferably, 50% or more, of the grain boundary becomes a crystal phase, thus achieving a sintering body having both high mechanical strength and high thermal conductivity.

In this connection, when the above cooling rate is excessively small, the manufacturing time of the ceramic substrate is disadvantageously prolonged. Therefore, the cooling rate is preferably set to a range of 10 to 100° C. By setting the cooling rate to the above range, the ratio of the crystal grain in the grain boundary phase can attain to 20% or more, preferably 20–95%.

The silicon nitride sintered body produced by the above method achieves a porosity of 2.5% or less, a thermal conductivity of 70 W/mK (at 25° C.) or greater, preferably, 80 W/mK or greater, and good mechanical characteristics, that is, a transverse strength of 600 MPa or greater.

Particularly, since a predetermined amount of Mg and Hf is added to the above sintered body in addition to the rare earth element, an increase of strength of the sintered body is further advanced, the surface roughness of the sintered surface of the resulting sintered body is reduced and a size of pore or void existing at the surface of the sintered body is decreased thereby to improve the strength of the sintered surface. Therefore, even if the silicon nitride sintered body is not subjected to a grinding work using a rotary grinder to which abrasive grains are fixed, there can be effectively obtained a silicon nitride sintered body having less anisotropy in surface roughness.

Conventionally, there have been many circumstances where the surface roughness of the ceramic substrate composed of the above silicon nitride sintered body or the like was reviewed and researched from the point of view of bonding strength of a heat generating resistor or a metal circuit plate to be bonded to a ceramic substrate. However, an influence of anisotropy in the surface roughness have not been reviewed at all.

In contrast to these circumstances, a remarkable effect is obtained in the present invention by reducing the anisotropy in the surface roughness of the ceramic substrate to less than a predetermined value. More concretely to say, provided that a surface roughness in terms of arithmetical average surface roughness (Ra) in arbitral one direction of the ceramic substrate is Ra1 while a surface roughness (Ra) in a direction having a different angle of 90° i.e. normal to the one direction of the ceramic substrate is Ra2 when each of ratios of Ra1/Ra2 and Ra2/Ra1 is controlled to be 1.5 or less, the influence caused by the anisotropy in the surface roughness can be eliminated, so that a crack would not occur even if a bending moment is applied to the circuit board from any directions, thereby to obtain an effect of improving the transverse strength of the ceramic substrate.

Figure 4:
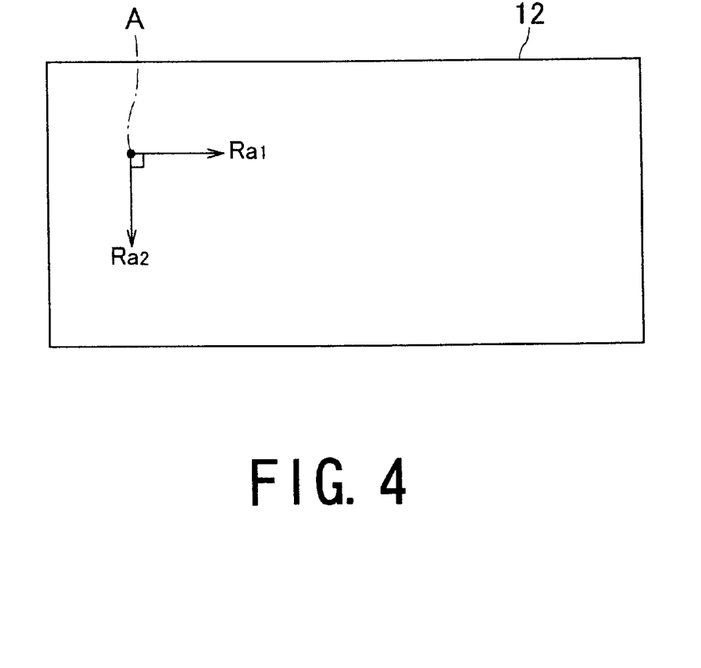
FIG. 4 is a plan view showing a measuring direction along which a surface roughness of front or rear surface of a ceramic substrate is measured.

The surface roughness (Ra) specified in the present invention is an arithmetical average surface roughness prescribed in Japanese Industrial Standard (JIS) B0601. The anisotropy in surface roughness of the above ceramic substrate is measured in accordance with the following procedure. Namely, as shown in FIG. 4, with respect to arbitrary one measuring point A on the ceramic substrate 12, the surface roughness Ra1 in one direction is measured while the surface roughness Ra2 in a direction normal to the one direction is also measured, and this measuring operation is repeated with respect to five or more of the measuring points selected from an entire surface of the ceramic substrate 12. Thereafter, respective average values (Ra1 and Ra2) are calculated.

When the above ratios (Ra1/Ra2 and Ra2/Ra1) of the surface roughness (Ra1, Ra2) in directions normal to each other exceed 1.5, a brittle portion is disadvantageously formed in accordance with a direction of applying a stress to the ceramic substrate, so that an improving effect of increasing the transverse strength of the ceramic substrate becomes insufficient, and cracks or the like are liable to occur. Therefore, the ratios of the surface roughness are set to 1.5 or less, preferably to 1.2 or less, more preferably to 1.1 or less.

In addition, when the surface roughness (Ra) of the ceramic substrate is excessively large, fine cracks are liable to occur at coarse portions of the surface as a starting point of the crack, and a trough portion of coarse surface functions as, so called, "cutout" thereby to easily cause cracks. Therefore, it is preferable to set the surface roughness of both front and rear surfaces of the ceramic substrate to 0.6 $\mu$m or less.

Further, a thickness of the ceramic substrate used in the present invention is preferably set to 0.7 mm or less. Furthermore, it is preferable that the ceramic substrate is constituted by a silicon nitride sintered body having a thermal conductivity of 60W/mK or more.

The following findings and knowledge had been obtained from experiments and heat-resistance simulations conducted by the inventors of the present invention. That is, in a case where a metal circuit plate composed of a copper plate having a thickness of 0.3 mm was bonded to a ceramic substrate thereby to form a ceramic circuit board for a power module, it was confirmed that almost the same heat-resistance values were obtained in the following two cases:
Case 1: a conventional AlN substrate having a thermal conductivity of 170 W/mK was used and thickness of the AlN substrate was set to 0.8 mm; and
Case 2: a $Si_3N_4$ substrate having a thermal conductivity of 90 W/mK was used and thickness of the $Si_3N_4$ substrate was reduced to be 0.4 mm.

Accordingly, particularly in a case where a $Si_3N_4$ substrate is used as the ceramic substrate, it is preferable that the thickness of the substrate is set to 0.4 mm or less from a point of view of reducing the heat-resistance value.

The ceramic substrate used in the present invention is prepared in accordance with a manufacturing method comprising the steps of: mixing ceramic material powder with sintering agent to form a mixed material; molding the mixed material using a sheet-molding method such as a doctor blade method or the like or an extrusion method to form a sheet-shaped molded body having a desired thickness; and degreasing and sintering the molded body thereby to prepare a ceramic substrate of which thickness is controlled by only the above steps.

In particular, when the doctor-blade method is utilized, it is easy to control the surface roughness (Ra) of the ceramic substrate to be 0.6 $\mu$m or less even if the resulting sintered body is not subjected to a grinding work. In this connection, the present invention is characterized by using a ceramic substrate which is not substantially subjected to a grinding work. However, for the purpose of removing separating powders adhered to the ceramic substrate during the sintering operation, the ceramic substrate is subjected to a surface treatment such as a honing treatment or the like which imparts less impact force to the ceramic substrate. Accordingly, the term "grinding work" used in the explanation for the circuit board of the present invention does not include a honing treatment.

The honing treatment is an operation to finish an objective surface by blasting fine abrasive grains onto the surface by the action of a pressurized fluid such as air, water or the like. When the above honing treatment is performed to the ceramic substrate, a sintering trash and the separating powder such as BN powder adhered to the surface of the ceramic substrate during the sintering operation can be effectively removed.

As the example of the abrasive grain used in the honing treatment, sintered grains such as alumina ($Al_2O_3$), zirconia ($ZrO_2$), silicon carbide (SiC), boron nitride (BN) or glass beads can be used. Further, it is preferable to use abrasive grains having a grain size (count No.) of #100 or more, preferably having a grain size of #200 to #400.

A blasting pressure (honing pressure) for the abrasive grains is preferably set to a range of 0.05 to 0.5 MPa. When the honing pressure is less than 0.05 MPa, the sintering trash or the like adhered to the ceramic substrate cannot be sufficiently removed, or much time is required for completely removing the sintering trash. On the other hand, when the honing pressure exceeds 0.5 MPa, an impact force becomes large, so that there is disadvantageously formed a warp in the ceramic substrate. In particular, in a case where the ceramic substrate is thin so as to provide a thickness of 0.4 mm or less, by setting the honing pressure to a range of 0.05 to 0.5 MPa, the formation of the above warp can be effectively prevented, thus being preferable.

After completion of the above honing treatment, since many chips and trashes of the abrasive grains are adhered to the surfaces of the ceramic substrate, a step of cleaning and removing the chips and trashes is required. As the cleaning and removing method, there can be used a method in which the surface of the ceramic substrate is wiped with a brush formed of resin.

However, according to the following ultrasonic cleaning, even a fine abrasive grain chip can be effectively removed. To put it concretely, under a state where the ceramic substrate is dipped in water, alcohol or organic solvent or the like, a micro vibration caused by an ultrasonic having a frequency of 0.5 MHz or more, preferably 0.8–1.2 MHz is applied, thereby to quickly and easily remove the fine abrasive grain chips or the like.

In a case where the abrasive grain chips or the like are removed by means of a brush, a brush formed of metal fibers may also be used. In this case, however, there may be a fear that an attacking property against the surface of the ceramic substrate will disadvantageously increase. Therefore, the brush formed of resin is more preferable than the brush formed of metal fibers.

By the way, since the abrasive grains such as alumina, zirconia, SiC, glass beads or the like and $Si_3N_4$ substrate after being sintered would not react with water, the above materials are suitable for being subjected to the ultrasonic cleaning treatment using water as a cleaning solvent.

In the above honing treatment and the ultrasonic cleaning treatment, an impact force to be applied to the ceramic substrate is small, so that the ceramic substrate would be less damaged, thus being preferable. In particular, in a grinding work using a surface grinding machine equipped with a conventional rotary grinder, many chipping flaws were disadvantageously generated. In contrast, according to the method of the present invention, such chipping flaws hardly occur, so that the breakdown voltage of the ceramic substrate can be increased to be 20 kV/mm or more.

Conventionally, a ceramic substrate having a thin thickness had been prepared in accordance with a method comprising the steps of: press-molding a material mixture to prepare a molded body; sintering the molded body to form a sintered body; conducting a grinding work to thus obtained sintered body so as to provide a predetermined thickness. As a result, many grinding flaws and chipping flaws were inevitably formed on the surface of the ceramic substrate due to a strong impact force applied thereto during the grinding operation.

In particular, in the press-molding operation using a molding die, the surface roughness of this molding die is transferred as it is to the molded body. Therefore, unless a molding die of which surface roughness is strictly controlled is used, the surface roughness of the ceramic substrate cannot be lowered to be 0.6 $\mu$m or less without conducting a grinding work.

As a result, in a case where a ceramic circuit board is manufactured by using the above ceramic substrate, when a bending moment is applied to the ceramic substrate in a direction normal to a direction along which chipping flaws are formed, a transverse strength of the ceramic substrate is disadvantageously lowered in comparison with a case where the bonding moment is applied to the substrate in another direction.

Further, a damaged portion such as micro crack or the like or the chipping flaw caused by the grinding work also exert a bad influence on a transverse strength and a heat-cycle resistance characteristic, so that there is posed a problem of lowering a dielectric withstanding voltage characteristic between the front and rear surfaces of the ceramic substrate.

In contrast to this, in the present invention, the ceramic substrate is controlled to provide a predetermined thickness at a stage of preparing the sheet-shaped molded body, and the thickness of the ceramic substrate is not controlled by the grinding work. Therefore, the grinding flaws and the chipping flaws are hardly formed, and the surface roughness of the ceramic substrate in any directions are almost the same to each other, so that the ratio of the surface roughness of the two directions normal to each other becomes 1.5 or less. Accordingly, the brittle portion due to the anisotropy in the surface roughness is hardly formed, so that the transverse strength is not lowered even if a bending strength or the like is applied to the circuit board from any directions whereby a high strength characteristic and durability can be obtained.

Furthermore, when the surface treatment such as the honing treatment or the ultrasonic cleaning treatment is subjected to the ceramic substrate, then a metal circuit portion is integrally formed to a surface of the ceramic substrate, there can be provided a ceramic circuit board according to the present invention.

In this regard, the above metal circuit portion can be formed of an electrically conductive metal circuit plate such as copper (Cu) plate or aluminum (Al) plate or the like. However, the metal circuit portion can be also formed by a metallized layer composed of refractory metals such as tungsten (W), molybdenum (Mo) or the like or silver (Ag). The above metallized layer is formed in accordance with a post-fire method in which a metal paste containing W, Mo, Ag is coated on the surface of the ceramic substrate so as to provide a predetermined pattern, then the coated paste is sintered and solidified.

In a case where the above circuit portion is formed of a metal circuit plate such as Cu plate, Al plate or the like, a method of bonding the metal circuit plate to the ceramic substrate is not particularly limited, and conventionally available methods such as a direct bonding copper method (DBC method), an active metal brazing material method can be suitably used.

In a case where non-oxide type ceramic substrate such as $Si_3N_4$ substrate, AlN substrate or the like is used and a circuit board is prepared by the direct bonding copper method, it is preferable that the above non-oxide type ceramic substrate is previously subjected to an oxidizing treatment so as to form an oxide layer having a thickness of 0.5–4 $\mu$m whereby the bonding strength between the ceramic substrate and the metal circuit plate can be further increased.

Further, as a brazing material used in a case where the metal circuit plate is bonded to the surface of the ceramic substrate, there can be suitably used an Ag—Cu type brazing material having an eutectic composition, containing: 0.5–5 mass % (wt %) of at least one active metal selected from the group consisting of Ti, Zr, Hf, Al and Nb; 55–75 mass % of Ag; and 15–40 mass % of Cu.

In addition, when 2–7 mass % (total 14 mass % or less) of each of In and Sn are added to the above brazing material, the bonding temperature for the metal circuit plate can be lowered to 800° C. or less, so that a thermal affection against the ceramic substrate can be reduced.

In general, the thermal affection is caused by the difference in thermal expansion coefficients of the ceramic substrate and the metal circuit plate. The higher bonding temperature would result in increase of this affection. Therefore, the lowering the bonding temperature is effective to reduce the heat-affection.

In a case where Ag—Cu type brazing material is used, the bonding temperature is within a range of 750–900° C. On the other hand, in a case where Al—Si type brazing material is used, the bonding temperature is about 650° C. A heat treating time at the bonding operation is 1–30 minutes. Further, when the bonding operation is performed in air atmosphere, structural members are oxidized and deteriorated, so that it is preferable to perform the bonding operation in a vacuum atmosphere of $1.33 \times 10^{-2}$ Pa or less.

In a case where the metal circuit plate as the above metal circuit portion is integrally bonded to the ceramic substrate in accordance with the above active metal brazing method or the direct bonding copper method, the bonding strength (peel strength) of the metal circuit plate is 12 kN/m or more, so that there can be provided a ceramic circuit board having an excellent durability (heat-cycle characteristic).

On the other hand, in a case where the metal circuit portion is a metallized layer formed by the post-fire method, the bonding strength of the metallized layer is relatively lowered in comparison with that formed by the above active metal brazing method.

According to the ceramic circuit board and method of manufacturing the same as constructed above, the ratio of the surface roughness of the ceramic substrate in one direction with respect to the surface roughness in a direction normal to the one direction is set to 1.5 or less thereby to reduce an anisotropy in surface roughness, so that a brittle portion due to the anisotropy in the surface roughness is hardly formed even if a bending strength or the like is applied to the circuit board from any directions whereby the transverse strength of the ceramic circuit board is increased, and cracks are hardly occur during an assembling process of the circuit board. As a result, the ceramic circuit board having a high reliability can be manufactured with a high production yield and a low cost.

In addition, since a thin silicon nitride substrate is used as the ceramic substrate so as to reduce a heat resistance, there can be provided a ceramic circuit board excellent in heat radiating property, and having a high bending strength, a sufficient withstand voltage characteristic and a high reliability. In particular, since the anisotropy in surface roughness of the ceramic substrate is eliminated without conducting a grinding work imparting a large impact force, the defects such as chipping flaws or the like are hardly occurred to the ceramic substrate. Therefore, an excellent dielectric breakdown voltage can be obtained even if the ceramic substrate is formed to be thin. Further, the silicon nitride substrate per se has a high structural strength and a high fracture toughness, it becomes also possible to improve the heat cycle resistance characteristic of the circuit board.

BRIEF DESCRIPTION OF THE DRAWINGS

Other objects and aspects of the present invention will become more apparent from the following description of embodiments with reference to the accompanying drawings in which.

DETAILED DESCRIPTION OF THE PREFERRED EMBODIMENTS

Next, preferred embodiments of the ceramic circuit board according to the present invention will be explained more concretely with reference to the accompanying drawings on the basis of the following Examples and Comparative Examples.

EXAMPLES 1–6

A material powder mixture was prepared by adding 5 wt % of $Y_2O_3$ (yttrium oxide) powder having an average grain size of 0.7 $\mu$m and 1.5 wt % of $Al_2O_3$ (alumina) powder having an average grain size of 0.5 $\mu$m as a sintering assistant agent, to silicon nitride material powder containing 1.3 wt % of oxygen, 0.15 wt % of impurity cationic elements and 97 wt % of α-phase silicon nitride, and having an average grain size of 0.55 $\mu$m, followed by wet-mixing the materials in ethyl alcohol for 24 hours, and drying the mixture. After adding a predetermined amount of an organic binder and a solvent to the material powder mixture, the mixture was homogeneously mixed thereby to prepare a material slurry.

Next, the above material slurry was sheet-molded in accordance with a doctor blade method while an opening width of a blade and an extrusion rate of the material slurry extruded from the blade were controlled, thereby to prepare a number of sheet-shaped molded bodies. Then, thus obtained molded bodies were degreased in a nitrogen gas ($N_2$) atmosphere at a temperature of 700° C. for two hours. Thereafter, the degreased molded bodies were sintered and further densified by holding the bodies in a nitrogen gas atmosphere under a normal pressure to 7 atm at a temperature range of 1800–1900° C. for 3–6 hours.

Thereafter, the sintered bodies were cooled at different cooling rates of: 100° C./hr (Examples 1–3, 5); 50° C./hr (Example 4); and 600° C./hr i.e. a self-cooling rate (Example 6); until the temperature in a sintering furnace was reduced down to 1500° C., by controlling an amount of power supplied to a heating unit associated with the sintering furnace, thereby to prepare a number of silicon nitride substrates for the respective Examples each having a size of 60 mm-long×40 mm-wide, and having a thickness shown in Table 1.

Next, with respect to both surfaces of the respective silicon nitride substrates, a honing treatment was conducted, then an abrasive grain chip removing treatment was performed. The conditions such as a material, count number, honing pressure in the honing treatment, solvent, frequency of an ultrasonic in the ultrasonic cleaning (Examples 1–4, 6) and solvent or the like in the resin brush cleaning as the abrasive grain chip removing process (Example 5) are shown in Table 1. By conducting the above honing treatment and the abrasive grain chip removing treatment, silicon nitride substrates for the respective Examples were prepared.

COMPARATIVE EXAMPLES 1–3

The sintering treatment was repeated under the same conditions as in Examples except that the material powder mixture prepared in Examples were press-molded at a molding pressure of 100 MPa, and the cooling rates after the sintering operation were set to 100° C./hr (Comparative Examples 1, 2) and 50° C./hr (Comparative Example 3), thereby to prepare silicon nitride substrates for the respective Comparative Examples.

Further, as shown in Table 1, the obtained silicon nitride substrate was subjected to the honing treatment using coarse alumina abrasive grains, thereby to prepare a silicon nitride substrate for Comparative Example 1.

On the other hand, the honing treatment and the abrasive grain chip removing treatment were not performed to the silicon nitride substrate obtained as a sintered body, thereby to adopted the sintered body as it is as a silicon nitride substrate for Comparative Example 2.

On the other hand, both surfaces of the silicon nitride substrate obtained as a sintered body were subjected to a grinding work using a rotary grinder associated with a surface grinding machine toward a shorter side direction of the substrate until a thickness of the substrate was reduced to a value shown in Table 1, thereby to prepare a silicon nitride substrate for Comparative Example 3.

In the silicon nitride substrates of Examples 1–5 and Comparative Examples 1–3 prepared as above, the boundary phases were crystallized within a range of 20–95 vol %. On the other hand, in the silicon nitride substrate of Example 6 prepared by self-cooling (furnace-cooling) the sintered body after the sintering operation, a crystallized ratio of the grain boundary phase was about only 10%.

Then, an average value of surface roughness Ra1 of the respective silicon nitride substrates prepared as above and an average value of surface roughness Ra2 in a direction normal to the one direction were measured as shown in FIG. 4. In this connection, among the surface roughness of Ra1 and Ra2 in the two directions, a larger one was indicated as Ra1 for the sake of convenience.

Each of the surface of the respective silicon nitride substrates for Examples and Comparative Examples prepared as above was observed by means of a microscope so as to perform a microscope inspection, whereby a ratio of generated chipping flaws each having a diameter of 1 μm or more was measured while a transverse strength of the substrate was also measured. That is, three regions each having a unit area of 30 μm-long×30 μm-wide are arbitrarily set on the surface of the respective substrates, then the numbers of the chipping flaws generated and observed within the respective regions are averaged, and the above ratio of the generated chipping flaw is indicated by the average number of the chipping flaws per unit area.

Further, in order to evaluate the strength characteristics of the respective silicon nitride substrates for Examples and Comparative Examples prepared as above, a three-point bending test was conducted thereby to measure a transverse strength of the substrate. Namely, each of the silicon nitride substrates was supported in a longitudinal direction by a pair of transverse testing jigs so that a supporting span was set to 50 mm. Under this supported state, a pressing force was applied to the substrate by means of a pressing jig provided to an upper central surface portion of the substrate. Then, the pressing force was increased and a maximum pressing force when the substrate caused a breakage was measured. The transverse strength of the substrate was calculated from the maximum pressing force. The respective measuring results are shown in the following Table 1.

As is clear from the results shown in Table 1, in the silicon nitride substrate of Comparative Example 3 prepared by conducting the grinding work to both surfaces of the ceramic substrate, the ratio of the chipping flaws generated on the surface of the substrate is disadvantageously increased.

Next, the ceramic circuit boards of the respective Examples and Comparative Examples, in which various metal circuit portions are bonded to the respective silicon nitride substrates through various bonding brazing materials, will be explained hereunder.

That is, various brazing materials containing active metals and having compositions shown in Table 2 were prepared, then the brazing material was screen-printed onto both surfaces of the silicon nitride substrate as a ceramic substrate. In this regard, the thickness of the brazing material layer coated on the substrate was within a range of 15–35 μm. After the printed brazing material layer was dried, a metal plate having a thickness shown in Table 2 was provided on a front surface side of the silicon nitride substrate, while a metal plate having a thickness of 0.25 mm was provided on a rear surface side of the silicon nitride substrate, thereby to prepare the respective laminated bodies.

Then, the respective laminated bodies were heated in a high vacuum atmosphere of $1.33 \times 10^{-2}$ Pa or less at a heat treating temperature shown in Table 2 for 10–20 minutes,

TABLE 1

| | Ceramic Substrate | | | Surface Treatment | | | |
| | | Thermal | | Honing Treatment | | | Abrasive Grain Chip |
| | | Conductivity | Thickness | Abrasive Grain | | Pressure | Removing Process |
| Sample | Material | (W/mK) | (mm) | Material | Count No. | (MPa) | Method |
|---|---|---|---|---|---|---|---|
| Example 1 | $Si_3N_4$ | 70 | 0.32 | Alumina | #200 | 0.1 | Ultrasonic Cleaning |
| Example 2 | $Si_3N_4$ | 70 | 0.32 | Alumina | #400 | 0.2 | Ultrasonic Cleaning |
| Example 3 | $Si_3N_4$ | 70 | 0.50 | SiC | #200 | 0.05 | Ultrasonic Cleaning |
| Example 4 | $Si_3N_4$ | 90 | 0.32 | Alumina | #600 | 0.1 | Ultrasonic Cleaning |
| Example 5 | $Si_3N_4$ | 70 | 0.635 | Alumina | #200 | 0.2 | Resin Brush Cleaning |
| Example 6 | $Si_3N_4$ | 60 | 0.32 | Alumina | #300 | 0.15 | Ultrasonic Cleaning |
| C. Example 1 | $Si_3N_4$ | 70 | 0.32 | Alumina | #50 | 0.1 | — |
| C. Example 2 | $Si_3N_4$ | 70 | 0.32 | None | — | — | — |
| C. Example 3 | $Si_3N_4$ | 90 | 0.32 | None | — | — | — |

| | Surface Treatment | | | Ceramic Substrate | | | | |
| | Abrasive Grain Chip Removing Process | | | Surface Roughness | | | Ratio of Generated | Transverse |
| | | Frequency | Grinding | Ra(μm) | | Ratio | Chipping Flaws | Strength |
| Sample | Solvent | (MHz) | Work | Ra1 | Ra2 | Ra1/Ra2 | piece/900 μm² | (MPa) |
|---|---|---|---|---|---|---|---|---|
| Example 1 | Water | 0.8 | None | 0.30 | 0.21 | 1.4 | 0 | 650 |
| Example 2 | Ethanol | 1.0 | None | 0.20 | 0.18 | 1.1 | 0 | 721 |
| Example 3 | Acetone | 1.5 | None | 0.30 | 0.25 | 1.2 | 0 | 693 |
| Example 4 | Water | 1.0 | None | 0.45 | 0.38 | 1.2 | 0 | 625 |
| Example 5 | Water | — | None | 0.35 | 0.27 | 1.3 | 0 | 655 |
| Example 6 | Water | 1.0 | None | 0.40 | 0.27 | 1.3 | 0 | 705 |
| C. Example 1 | None | — | None | 0.90 | 0.56 | 1.6 | 0 | 610 |
| C. Example 2 | None | — | None | 0.80 | 0.70 | 1.1 | 0 | 553 |
| C. Example 3 | None | — | Both Surfaces | 0.40 | 0.24 | 1.7 | 5 | 690 |

Note: C. Example denotes Comparative Example thereby to integrally bond the respective metal plates onto the silicon nitride substrates through various brazing material layers. In case of only Example (1–2), W-paste was coated onto both surfaces of the $Si_3N_4$ substrate, thereafter the coated substrate was sintered at a temperature of 1800° C thereby to form a W-layer having a thickness of 30 μm. Thereafter, each of the metal plates and W layer was subjected to an etching treatment so as to form metal circuit portions each having a predetermined circuit pattern, thereby to prepare the silicon nitride circuit boards of the respective Examples and Comparative Examples.

Figure 1:
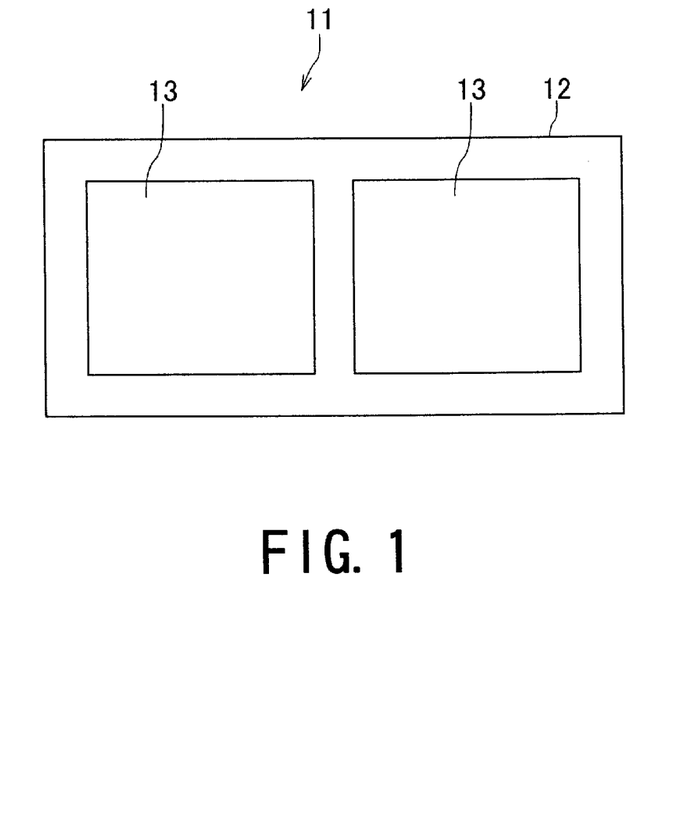
FIG. 1 is a plan view showing a ceramic circuit board according to one embodiment of the present invention.
Figure 2:
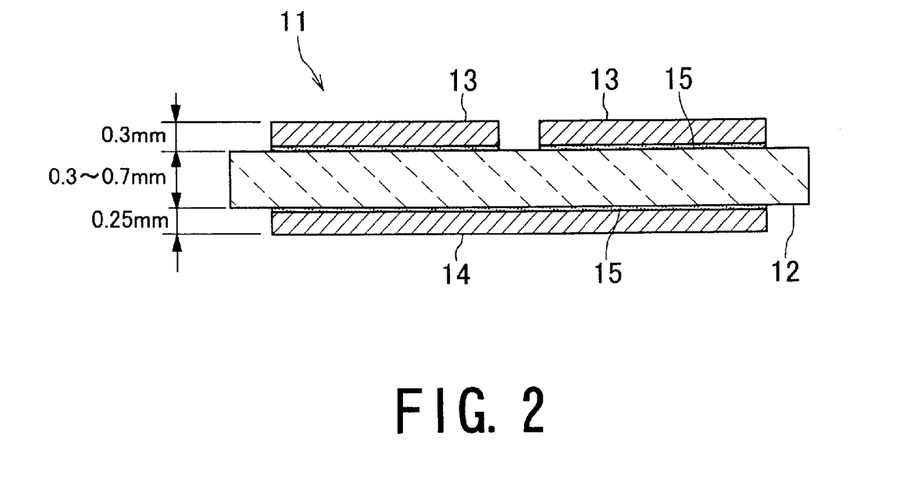
FIG. 2 is a cross-sectional view of the ceramic circuit board shown in FIG. 1.
Figure 3:
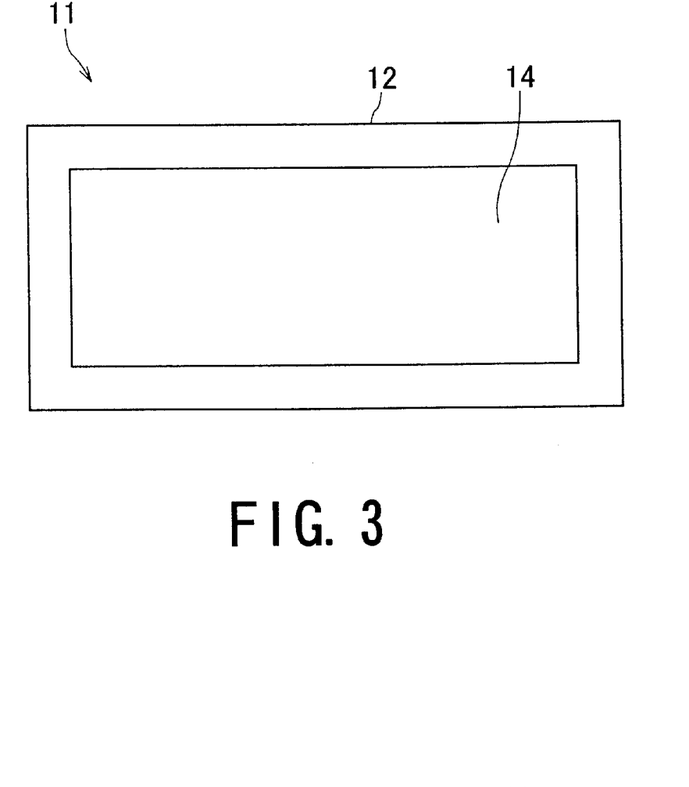
FIG. 3 is a bottom view of the ceramic circuit board shown in FIG. 1.

FIGS. 1–3 are a plan view, a cross sectional view and a bottom view, respectively showing a structure of one embodiment of the silicon nitride circuit board as the ceramic circuit board 11 prepared as above.

That is, each of the silicon nitride circuit boards 11 of the above Examples and Comparative Examples is constituted in such a manner that a copper (Cu) circuit plate or Al circuit plate as the metal circuit portion 13 having a predetermined thickness is integrally bonded onto the front surface of the silicon nitride substrate as the ceramic substrate 12 through the brazing material layer 15, while a rear copper plate or a rear Al metal plate 14 having a thickness of 0.25 mm was integrally bonded onto the rear surface of the silicon nitride substrate 12 through the brazing material layer 15.

In order to evaluate a heat cycle resistance characteristic of the respective silicon nitride circuit boards, the following thermal cycle test was conducted to each of the silicon nitride circuit boards. That is, the evaluation was conducted by measuring a ratio of cracks caused in TCT (thermal cycle test) at a stage when TCT cycle was repeated for 2000 cycles.

Note, one TCT cycle was set to comprise the steps of: cooling the ceramic circuit board to a temperature of –40° C. and holding the ceramic circuit board for 30 minutes; thereafter heating the ceramic circuit board to a room temperature (RT) and holding the ceramic circuit board for 10 minutes; subsequently heating the ceramic circuit board to a temperature of +125° C. and holding the ceramic circuit board for 10 minutes. The ratio of the cracks formed after the heat cycle was repeated for 2000 cycles was measured as a wholesome ratio (soundness ratio) η.

The above wholesome ratio η is given from the following equation provided that an entire peripheral length of the metal circuit plate bonded to the ceramic substrate is L, while a total length of portions of the ceramic substrate at which a crack is formed is $$\sum_{i}^{n} Xi.$$

$$\eta(\%) = \left(1 - \frac{\sum_{i}^{n} Xi}{L}\right) \times 100$$

That is, the wholesome ratio of 100% means that there is no generation of the cracks, and the wholesome ratio of 0% means that the cracks are formed to the entire peripheral portion of the ceramic substrate. The results of the measuring the wholesome ratios are shown in Table 1.

In order to evaluate an electrically insulating characteristic of the respective ceramic circuit boards of Examples and Comparative Examples prepared as above, the following partial-discharging test was conducted to each of the ceramic circuit boards. That is, each of the ceramic circuit boards was dipped into an insulation oil (trade name: Frorinart), then an electrode was provided to the metal circuit plate or W layer bonded to both surfaces of the ceramic substrate, respectively. Thereafter, an alternating voltage was applied to a portion between the paired electrodes at a voltage increasing rate of 10 KV/minute. An applied voltage at a time when the circuit board discharged an electric charge of 10 pC (pico coulomb) was measured as a partial-discharge starting voltage, thereby to calculate a withstand voltage per unit thickness of the ceramic substrate. In addition, a bonding strength of the respective metal circuit plates was also measured. The above measuring and calculating results are shown in Table 2 hereunder.

TABLE 2

| | | Metal Circuit Portion | | Brazing Material | | Crack Resistance in TCT, Wholesome Ratio (%) | Breakdown Voltage (kV/mm) | Bonding Strength (kN/m) |
| | Ceramic | | Thickness | | Heat Treating | | | |
| Sample | Substrate | Material | (mm) | Composition (mass %) | Temperature ° C. | | | |
|---|---|---|---|---|---|---|---|---|
| Example 1-1 | Example 1 | Copper Plate | 0.3 | 70Ag-27Cu-3Ti | 850 | 100 | 26 | 15 |
| Example 1-2 | Example 1 | W-Layer | 0.03 | — | 1800 | 100 | 25 | 4 |
| Example 2-1 | Example 2 | Copper Plate | 0.3 | 70Ag-27Cu-3Ti | 850 | 100 | 28 | 15.5 |
| Example 2-2 | Example 2 | Copper Plate | 0.4 | 67Ag-26Cu-2Ti-5In | 780 | 100 | 28 | 18 |
| Example 2-3 | Example 2 | Copper Plate | 0.3 | 67Ag-26Cu-2Ti-5Sn | 780 | 100 | 29 | 20 |
| Example 3 | Example 3 | Copper Plate | 0.3 | 70Ag-27Cu-2Ti-1Hf | 850 | 100 | 26 | 14 |
| Example 4 | Example 4 | Copper Plate | 0.3 | 70Ag-27Cu-3Ti | 850 | 98 | 27 | 15 |
| Example 5-1 | Example 5 | Copper Plate | 0.5 | 70Ag-27Cu-3Ti | 850 | 97 | 23 | 13 |
| Example 5-2 | Example 5 | Copper Plate | 0.3 | 67Ag-26Cu-2Ti-3In-2Sn | 760 | 99 | 23 | 19 |
| Example 5-3 | Example 5 | Al-Plate | 0.2 | 97Al-3Si | 650 | 100 | 24 | 12.5 |
| Example 6 | Example 6 | Copper Plate | 0.3 | 70Ag-27Cu-2Ti | 850 | 98 | 25 | 15 |
| C. Example 1 | C. Example 1 | Copper Plate | 0.3 | 70Ag-27Cu-3Ti | 850 | 90 | 23 | 8 |
| C. Example 2 | C. Example 2 | Copper Plate | 0.3 | 70Ag-27Cu-3Ti | 850 | Not Bonded | — | Not Bonded |
| C. Example 3 | C. Example 3 | Copper Plate | 0.3 | 70Ag-27Cu-3Ti | 850 | 88 | 17 | 15 |

Note: C. Example denotes Comparative Example board for 3 minutes; and cooling the ceramic circuit board to the room temperature (RT) and holding the ceramic As is clear from the results shown Table 1 and Table 2, in the ceramic circuit boards of the respective Examples in which the ratio of the surface roughness in the two directions of the silicon nitride substrate was controlled to be 1.5 or less, the heat cycle resistance characteristic, the bending strength characteristic and the withstand voltage characteristic were further improved in comparison with the ceramic circuit boards of Comparative Examples in which the above ratio of the surface roughness was 1.6 or more, so that it was confirmed that an excellent technical effect could be obtained.

In the ceramic circuit board of Example 6, however, since the thermal conductivity of the silicon nitride substrate was low, the circuit board was liable to suffer a heat affection thereby to relatively increase the ratio of crack formation. Further, in the ceramic circuit boards of Example (1–2), since the metal circuit portion was a metallized layer (W layer), the bonding strength of the metal circuit portion was disadvantageously decreased.

Furthermore, since the breakdown voltage was dominantly determined by the characteristics of the silicon nitride substrate, it was confirmed that a difference in the breakdown voltage in accordance with the bonding structures was small.

On the other hand, in the ceramic circuit boards according to Comparative Example 1 and Comparative Example 2 of which ceramic substrate was prepared through the press-molding operation, it was confirmed that if a surface-grinding was not performed, the surface roughness Ra of 0.6 μm or less or the ratio (Ra1/Ra2) of 1.5 or less could not be obtained.

In particular, in Comparative example 2, the ceramic substrate was not subjected to the surface treatment, and composed of a sintered body having a sintered surface as it was, so that it was impossible to bond the copper plate to the ceramic substrate. In addition, in also the circuit board of Comparative Example 3 in which the ceramic substrate was subjected to a grinding work, since an anisotropy in accuracy of the grinding work was revealed, it was confirmed to be difficult to set the ratio of Ra1/Ra2 to 1.5 or less. Further, it was confirmed that when the grinding work was performed, the grinding flaws were disadvantageously formed thereby to exert a bad influence on the characteristics of the circuit board.

Next, Examples of a case where the honing conditions and the ultrasonic cleaning conditions are changed will be explained hereunder.

EXAMPLES 7–12

With respect to silicon nitride sintered bodies each having a thermal conductivity of 90 W/mK and a size of 40 mm×60 mm×0.32 mm (thickness), a honing treatment and an ultrasonic cleaning treatment as the surface treatments were conducted under the conditions as shown in table 3 thereby to prepare $Si_3N_4$ substrates for the respective Examples. Note, the grinding work was not performed to the substrates.

Next, an average value of the ratio Ra1/Ra2 of the surface roughness Ra in two directions normal to each other of the respective substrates were measured, while the ratio of the chipping flaws formed per unit area of the respective substrates was also measured.

On the other hand, a brazing material having a composition of 70 Ag-27 Cu-3Ti in terms of mass % was prepared. Then, a copper circuit plate having a thickness of 0.3 mm was bonded to a front surface side of the above $Si_3N_4$ substrates through the above brazing material, while a rear copper plate (backing copper plate) having a thickness of 0.25 mm was bonded in a similar manner to a rear surface side of the above $Si_3N_4$ substrates through the above brazing material, thereby to prepare $Si_3N_4$ circuit boards of the respective Examples.

With respect to each of the $Si_3N_4$ circuit boards, the bonding strength (peel strength) of the copper circuit plate and the breakdown voltage were measured in the same manner as in Example (1–1), thereby to obtain the results shown in Table 3 hereunder.

TABLE 3

| | | Surface Treatment | | | | | | Ratio of Generated | | |
| | | Honing Treatment | | | Ultrasonic Cleaning | | | Chipping Flaws | Bonding | Breakdown |
| Sample | Substrate Material | Abrasive Grain Material | Count No. | Pressure (MPa) | Solvent | Frequency (MHz) | Ra1/Ra2 | Grinding Work | (piece/900 μm²) | Strength (kN/m) | Voltage (kV/mm) |
| Example 7 | $Si_3N_4$ | Glass Beads | #300 | 0.1 | Water | 0.5 | 1.1 | None | 0 | 17 | 29 |
| Example 8 | $Si_3N_4$ | Zirconia | #300 | 0.1 | Water | 0.5 | 1.1 | None | 0 | 14 | 27 |
| Example 9 | $Si_3N_4$ | Alumina | #200 | 0.05 | Water | 0.5 | 1.1 | None | 0 | 19 | 38 |
| Example 10 | $Si_3N_4$ | Alumina | #200 | 0.1 | Water | 1.0 | 1.1 | None | 0 | 16 | 25 |
| Example 11 | $Si_3N_4$ | Alumina | #30 | 0.6 | Water | 2.0 | 1.4 | None | 0 | 12 | 20 |
| Example 12 | $Si_3N_4$ | Alumina | #1000 | 0.7 | Water | 2.0 | 1.4 | None | 0 | 15 | 21 |

As is clear from the results shown in Table 3, in the ceramic circuit boards according to Examples 7–10 in which the abrasive grains having a suitable grain size were used and the silicon nitride substrates subjected to the honing treatment under a suitable honing pressure were used, the breakdown voltages were excellent to be 25–38 kV/mm and the amounts of warp of the silicon nitride substrate were all 0.5 mm or less.

In particular, in Example 9, since the honing pressure was small, a damage imparted to the surface of the silicon nitride substrate was less, so that the breakdown voltage could be significantly improved.

In this regard, the amount of warp of the ceramic substrate specified in the present invention was measured as a maximum height of a gap formed between a plane surface and a rear surface of the ceramic substrate in a longitudinal direction of the substrate when a warped substrate was disposed on the plane surface.

On the other hand, in case of Example 11 in which the honing treatment using abrasive grains having a coarse grain size was performed, or in case of Example 12 in which the honing pressure was excessively large although ultra-fine abrasive grains were used, the damage of the surface of the substrate was increased to be large, so that the breakdown voltages were relatively lowered. Particularly, in case of Examples 11–12 where the honing pressure was set to excessively large so as to exceed 0.5 MPa, a warp having a height of about 3 mm was disadvantageously caused, so that it was confirmed that the characteristics of the circuit board were lowered.

As described above, according to the ceramic circuit board and method of manufacturing the circuit board, the ratio of the surface roughness of the ceramic substrate in one direction with respect to the surface roughness in a direction normal to the one direction is set to 1.5 or less thereby to reduce an anisotropy in surface roughness, so that a brittle portion due to the anisotropy in the surface roughness is hardly formed even if a bending strength or the like is applied to the circuit board from any directions whereby the transverse strength of the ceramic circuit board is increased, and cracks are hardly occur during an assembling process of the circuit board. As a result, the ceramic circuit board having a high reliability can be manufactured with a high production yield and a low cost.

In addition, since a thin silicon nitride substrate is used as the ceramic substrate so as to reduce a heat resistance, there can be provided a ceramic circuit board excellent in heat radiating property, and having a high bending strength, a sufficient withstand voltage characteristic and a high reliability. In particular, since the anisotropy in surface roughness of the ceramic substrate is eliminated without conducting a grinding work imparting a large impact force, the defects such as chipping flaws or the like are hardly occurred to the ceramic substrate. Therefore, an excellent dielectric breakdown voltage can be obtained even if the ceramic substrate is formed to be thin. Further, the silicon nitride substrate per se has a high structural strength and a high fracture toughness, it becomes also possible to improve the heat cycle resistance characteristic of the ceramic circuit board.

What is claimed is:

1. A ceramic circuit board comprising:
   a ceramic substrate and a metal circuit portion bonded to a main surface of said ceramic substrate;
   a ratio of Ra1/Ra2 ranging from 1/1.5 to 1.5 in which a surface roughness in terms of arithmetical average surface roughness in one arbitrary direction of said main surface of said ceramic substrate is Ra1 while a surface roughness in a direction normal to said one arbitrary direction is Ra2, wherein a chipping flaw having a diameter of 1 $\mu$m or more is not formed on the surface of said ceramic substrate;
   a breakdown voltage of said ceramic substrate being 20 kV/mm or more;
   said metal circuit portion being bonded to said ceramic substrate through a brazing material layer containing at least one active metal selected from the group consisting of Ti, Zr, Hf, Al, and Nb;
   said metal circuit portion comprising a metal circuit plate such that a bonding strength between the metal circuit plate and the ceramic substrate is 12 kN/m or more; and
   said ceramic substrate having a thickness of 0.7 mm or less.

2. A ceramic circuit board according to claim 1, wherein said ceramic substrate comprises a silicon nitride sintered body having a thermal conductivity of 60W/mK or more.

3. A ceramic circuit board according to claim 1, wherein said metal circuit portion is bonded to said ceramic substrate through a brazing material layer containing at least one active metal selected from the group consisting of Ti, Zr, Hf, Al and Nb.

4. A ceramic circuit board according to claim 1, wherein said metal circuit portion is composed of a metal circuit plate, and a bonding strength of the metal circuit plate is 12 kN/m or more.

5. A ceramic circuit board according to claim 1, wherein said ceramic substrate has a thickness of 0.7 mm or less.

6. A ceramic circuit board according to claim 1, wherein said ceramic substrate has a thickness of 0.4 mm or less.

7. A ceramic circuit board according to claim 1, wherein each of said surface roughness Ra1 and said surface roughness Ra2 is 0.6 $\mu$m or less.

* * * * *